United States Patent
Peale

(10) Patent No.: US 6,370,219 B1
(45) Date of Patent: Apr. 9, 2002

(54) SELF-MODULATED, FILAMENT-BASED, SOLID STATE LASER

(75) Inventor: David Reese Peale, San Diego, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/294,485

(22) Filed: Apr. 20, 1999

(51) Int. Cl.[7] .................................................. H01S 3/10
(52) U.S. Cl. .............................. 378/28; 378/28; 378/64; 378/26; 378/19; 378/92; 378/96
(58) Field of Search ............................. 372/28, 26, 92, 372/96, 43, 49, 64, 19

(56) References Cited

U.S. PATENT DOCUMENTS 4,870,651 A * 9/1989 Taneya et al. ................. 372/50
5,625,617 A   4/1997 Hopkins et al. ............. 369/121

OTHER PUBLICATIONS

S. Arahira et al., Terahertz–rate optical . . . , Optics Lett., vol. 19, No. 11, pp. 834–836 (Jun. 1994).
E. R. Brown, Photomixing . . . , Appl. Phys. Lett., vol. 66, No. 3, pp. 285–287 (Jan. 1995).
M. F. C. Schemmann et al., Kink power . . . , Appl. Phys. Lett., vol. 66, No. 8, pp. 920–922 (Feb. 1995).
M. Ohkubo et al., Experimental Study of Beam Steering . . . , Jpn. J. Appl. Phys., vol. 35, pp. L34–L36 (Jan. 1996).
K. A. McIntosh et al., Terahertz photomixing . . . , Appl. Phys. Lett., vol. 67, No. 26, pp. 3844–3846 (Dec. 1995).
S. Arahira et al., Mode–Locking . . . , IEEE J. Quantum Electr., vol. 32, No. 7, pp. 1211–1224 (Jul. 1996).
M. D. Pelusi et al., THz optical beat frequency . . . , Appl. Phys. Lett., vol. 71, No. 4, pp. 449–451 (Jul. 1997).
P. Gu et al., Generation of sub–THz . . . , CLEO, San Francisco, May 3–8, 1998, Tech. Digest, pp. 261–262.

* cited by examiner

Primary Examiner—Frank G. Font
Assistant Examiner—Delma R. Flores Ruiz
(74) Attorney, Agent, or Firm—Michael J. Urbano

(57) ABSTRACT

A self-modulated solid state laser comprises an intracavity optical waveguide that supports a multiplicity of lasing filaments each at a different optical frequency. At least two of the filaments temporally beat with one another so as to modulate the intensity of the laser output. In accordance with one embodiment of our invention, the waveguide supports a multiplicity of transverse modes, and the laser includes a mode mixing mechanism that mixes the energy of at least two pairs of the modes, each coupled pair generating a separate filament. In an illustrative embodiment, the filaments are mode locked and the laser output is modulated at a frequency on the order of 1 THz.

18 Claims, 5 Drawing Sheets

SELF-MODULATED, FILAMENT-BASED, SOLID STATE LASER

CROSS-REFERENCE TO RELATED APPLICATIONS

This application was concurrently filed with application Ser. No. 09/294,486 entitled Filament-Based, Optical Detection Apparatus (Peale 9).

FIELD OF THE INVENTION

This invention relates to solid state lasers and, more particularly, to such lasers in which transverse modes are coupled to form optical filaments that beat with one another so as to modulate the laser output, typically at terahertz (THz) frequencies.

BACKGROUND OF THE INVENTION

There has been considerable interest in recent years in the development of sources of optical radiation that can be modulated at THz frequencies. These sources can be used for submillimeter spectroscopy, nondestructive internal imaging of opaque materials, and optical communications systems (especially those requiring low timing jitter pulse trains). One approach is to mix two laser radiation fields that differ in frequency by the desired THz frequency. Mixing is typically performed within a semiconductor amplifier or a fiber amplifier. The difference frequency is produced by nonlinear mixing within the amplifier gain material. Alternatively, mixing can be accomplished using a GaAs photoconductive mixer-antenna structure.

In some cases the outputs of two separate laser sources have been mixed. See, for example, McIntosh et al., *Appl. Phys. Lett.*, Vol. 67, No. 26, pp. 3844–3846 (1995), which is incorporated herein by reference. This approach has the disadvantage that the coherence of the mixing is subject to independent fluctuations from both source lasers. To address this limitation, other researchers have used a single laser source to produce both frequencies to be mixed; i.e., passive harmonic mode locking of a diode laser to create THz modulated radiation for use in driving photomixers to generate THz energy. See, for example, Arahira et al., *Optics Lett.*, Vol. 19, No. 11, pp. 834–836 (1994), which is incorporated herein by reference.

In one case a conventional multimode DBR laser was used to produce a number of longitudinal mode frequencies. Two of these frequencies were selected for mixing by selective filters that separated the desired frequencies from the multimode output spectrum. Since the longitudinal mode spacing of this DBR laser was 110 GHz, beat frequencies in increments in excess of 110 GHz could be produced. Mixing at 1.34 THz was demonstrated. See, for example, Pelusi et al., *Appl. Phys Lett.*, Vol. 71, No. 4, pp. 449–451 (July, 1997), which is incorporated herein by reference.

In yet another design, a two-grating DBR laser was used to limit the longitudinal mode spectrum to only two modes. In this case, the mode separation was 163.5 GHz. These two modes were then mixed in a GaAs photoconductive mixer-antenna to produce radiation modulated at 0.1635 THz. See, for example, Gu et al., *Proceedings of CLEO*, pp. 261–262 (May, 1998), which is incorporated herein by reference.

None of these laser optical sources has relied on the existence of optical filaments in order to modulate the radiation output at terahertz frequencies. In the context of solid state lasers that include a planar optical waveguide, the term filament as used herein means an intracavity, in-plane (i.e., in the plane of the waveguide) intensity distribution of the lasing radiation that exhibits a meandering (e.g., sinusoidal) pattern of nodes and peaks that weaves from one side of the waveguide cross-section to another (or from the top to the bottom of the waveguide cross section) along the longitudinal axis of the laser. A few prior art lasers have exhibited such filaments; e.g., 0.98 $\mu$m pump laser diodes and 1.3 $\mu$m buried heterostructure (BH) laser diodes investigated by Ohkubo et al., *Jpn. J. Appl. Phys.*, Vol. 35, pp. L34–L36 (1996) and Schemmann et al., *Appl. Phys. Lett.*, Vol. 66, No. 8, pp. 920–922 (1995), both of which are incorporated herein by reference. But prior art workers have considered filamentation in these lasers to be undesirable because the maximum useful output power is limited by the lateral beam deflection that occurs when the filament forms. In addition, the authors did not appreciate the way such filaments might be used to generate THz modulation.

SUMMARY OF THE INVENTION

In accordance with one aspect of the invention, a self-modulated, solid state laser comprises an intracavity optical waveguide that supports a multiplicity of lasing filaments each at a different optical frequency. At least two of the filaments temporally beat with one another so as to modulate the intensity of the laser output. In accordance with one embodiment of the invention, the waveguide supports a multiplicity of transverse modes, and the laser includes a mode mixing mechanism that mixes the energy of at least two pairs of the modes, each coupled pair generating a separate filament. In an illustrative embodiment, the filaments are mode-locked and the laser output is modulated at frequencies on the order of 1 THz.

BRIEF DESCRIPTION OF THE DRAWING

The invention, together with its various features and advantages, can be readily understood from the following more detailed description taken in conjunction with the accompanying drawing, in which.

Figure 1:
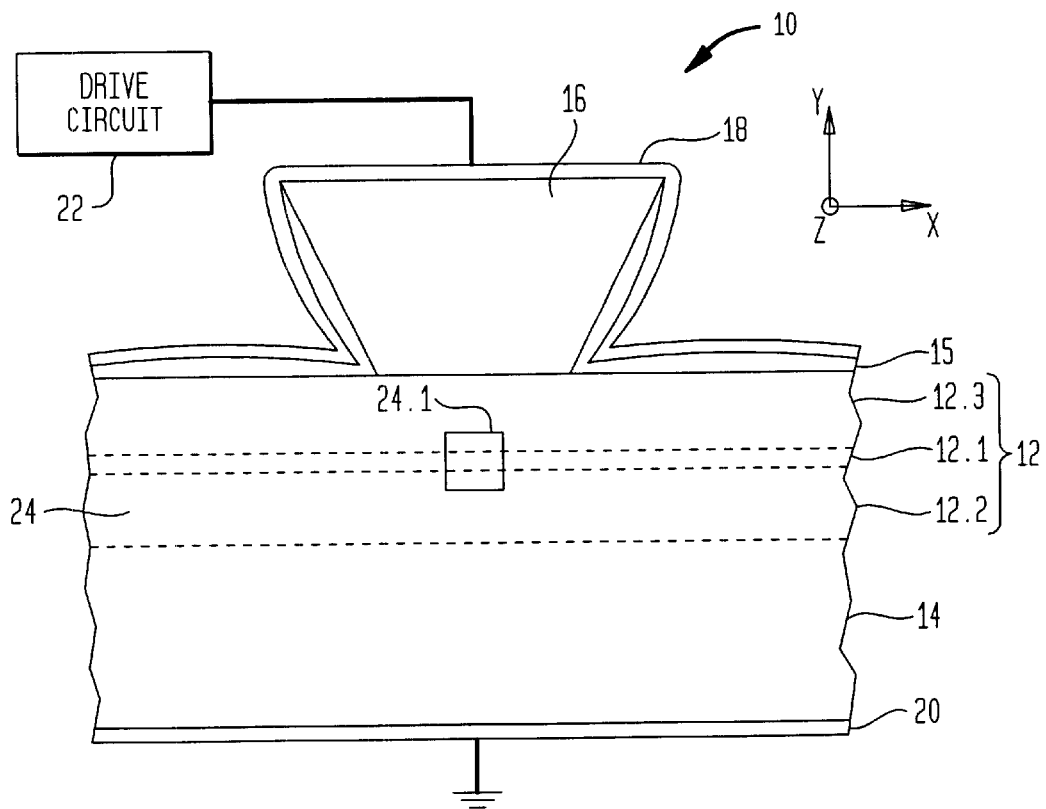
FIG. 1 is a schematic, end view of a ridge waveguide semiconductor laser in accordance with one embodiment of the invention in which mode mixing is provided by means of a structural feature (e.g., protrusion, recess or aperture) formed in/on a coating disposed on one facet of the laser.
Figure 2:
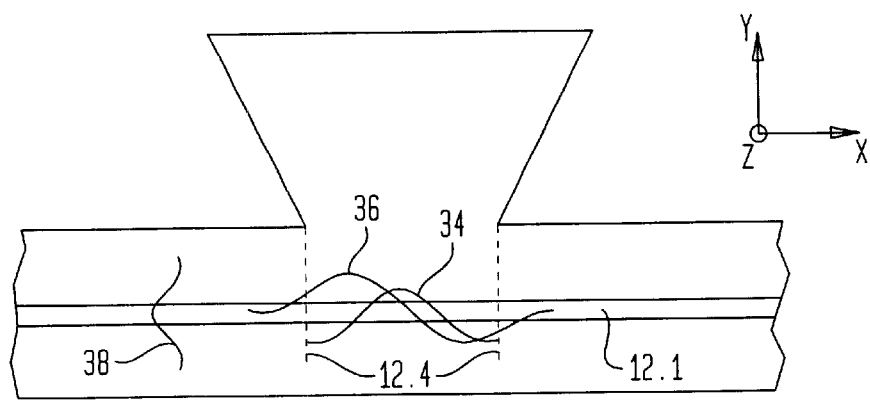
FIG. 2 is a schematic, end view of a ridge waveguide semiconductor laser useful in distinguishing transverse mode components 34 and 36, which are, respectively, fundamental and first order mode components parallel to the plane of the waveguide (x-z plane), from mode component 38, which is a fundamental mode component perpendicular to the plane of the waveguide. Depending on the thickness of the waveguide and the refractive index of the waveguide materials, the laser could also support higher order mode components perpendicular to the plane of the waveguide. The transverse modes may be either transverse electric (TE) modes which are polarized parallel to the plane of the waveguide, or they may be transverse magnetic (TM) modes which are polarized perpendicular to the plane of the waveguide. For simplicity the following discussion will focus on TE modes and will use the standard notation $TE_{nm}$ to designate that the mode is of order n perpendicular to the plane of the waveguide and of order m parallel to the plane of the waveguide. For example, the notation $TE_{00}$ designates a transverse electric mode of fundamental order (n=0) perpendicular to the plane of the waveguide and of fundamental order (m=0) parallel to the plane of the waveguide. Likewise, the notation $TE_{01}$ designates a transverse electric mode of fundamental order (n=0) perpendicular to the plane of the waveguide and of first order (m=1) parallel to the plane of the waveguide.
Figure 3:
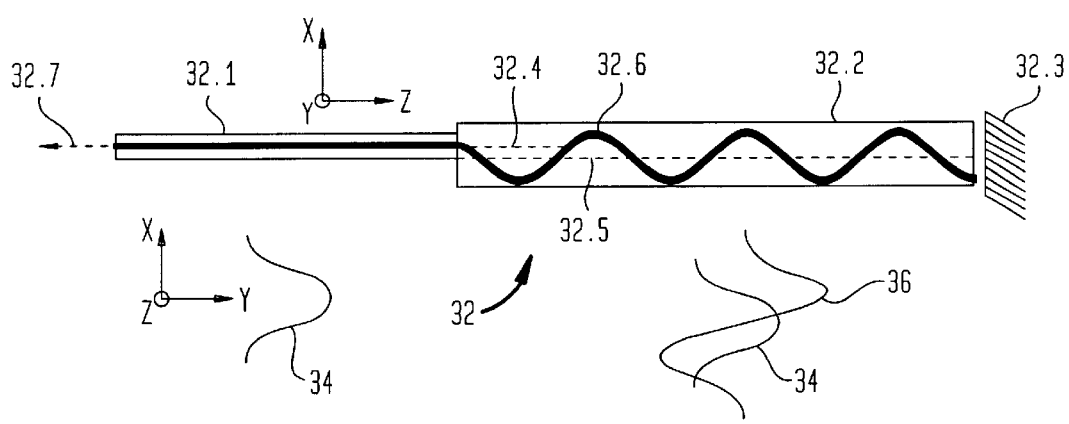
FIG. 3 is a schematic, top view of a tandem waveguide design for providing mode mixing in accordance with another embodiment of the invention.

In the interest of clarity and simplicity, FIGS. 1–3 have not been drawn to scale.

DETAILED DESCRIPTION OF THE INVENTION

General Laser Structure

With reference now to FIG. 1, a semiconductor laser 10 comprises an optical waveguide 12 that includes an active region 12.1 sandwiched between upper cladding region 12.3 and lower cladding region 12.2. The active region serves as the core of the waveguide, which illustratively is planar. (Alternatively, the active region could be located outside a waveguide but optically coupled thereto.) The lower cladding region is formed on a single crystal semiconductor body 14. Alternatively, the body itself may serve as the lower cladding in which case the layer 12.2 may be omitted. Body 14 typically includes a semiconductor substrate or a combination of such a substrate with another layer (e.g., an epitaxial layer grown on the top surface of the substrate).

The term region is intended to embrace a single layer, multiple layers or partial layers. The active region in particular may be a single layer as in a standard double heterostructure (DH), or it may include multiple layers as in multi-quantum well (MQW) lasers or quantum cascade (QC) lasers. Illustratively, lasers of this type are fabricated from Group III-V compound semiconductors; e.g., GaAs-based compounds such as GaAs/AlGaAs (for operation at about 0.7–1.0 $\mu$m), In-based Group III-V compounds such as GaAs/InGaAs (for operation at about 1.0 $\mu$m), InP/InGaAsP (for operation at about 1.3–1.55 $\mu$m) and GaInAs/AlInAs (for operation at 3–17 $\mu$m in QC lasers).

The laser may be pumped either optically or electrically, although the latter is more typical and currently suited to more practical applications. The most common form of electrical pumping is to supply current via drive circuit 22 to the laser under forward bias conditions; i.e., the cladding regions typically have opposite conductivity types, and the forward bias would be applied across electrodes 18 and 20. In order to constrain the applied current to flow in a relatively narrow channel across the active region, the laser may be designed to have, for example, a stripe geometry, a ridge waveguide geometry, a buried heterostructure (BH) geometry, or any of several other designs also well known in the art. A ridge waveguide design is illustrated in FIG. 1. Here, a ridge 16, in the shape of an inverted trapezoid, is disposed adjacent cladding region 12.3. Electrode 18 makes electrical contact with the top of ridge 16 but is electrically insulated from other parts of the top surface of the laser by means of insulating layer 15 (e.g., $SiO_2$).

As is well known in the art, the ridge may be etched or otherwise shaped from, or it may be formed on, the upper cladding region. A stop-etch layer (not shown) may be interposed between the ridge and the cladding to facilitate the etching process. Another alternative is to form the ridge as a non-inverted trapezoid (e.g., a mesa), as in the laser described by Hopkins et al., U.S. Pat. No. 5,625,617 issued on Apr. 29, 1997, which is incorporated herein by reference.

When the applied current exceeds the lasing threshold, the active region generates coherent, stimulated emission of radiation at a wavelength approximately determined by the bandgap of the active region in the case of standard semiconductor lasers or by the thickness of the quantum wells in QC lasers. When provided with optical feedback the device functions as a laser. This feedback is typically supplied by an optical cavity resonator formed, for example, by cleaved crystal facets (with or without suitable coatings), distributed feedback (DFB) gratings, distributed Bragg reflectors (DBRs), or a combination of them. In the laser depicted in FIG. 1, the resonator is formed by cleaved crystal facets that are oriented perpendicular to the longitudinal resonator axis (z-axis).

The stimulated emission in the waveguide is also characterized by transverse electric mode components 34, 36 and 38 depicted schematically in FIG. 2 as lying in the x-y plane. Mode components 34 and 36 are fundamental and first order mode components, respectively, parallel to the plane of the waveguide, whereas mode component 38 is a fundamental mode component perpendicular to the plane of the waveguide. For the case of mode components polarized parallel to the plane of the waveguide, mode components 38 and 34 taken together represent a $TE_{00}$ mode, and mode components 38 and 36 taken together represent a $TE_{01}$ mode.

A coating 24 having a recess, aperture, protrusion or other structural feature is formed on one facet of the laser for purposes of mode mixing, as described in the next section; the other facet may be left uncoated, or it too may be coated. The laser output may be extracted from either facet or both facets.

Mode Mixing

In accordance with one aspect of the invention, the laser 10 is designed so that the waveguide core (i.e., active region 12.1) is wide enough to support multiple TE mode components parallel to the plane of the waveguide, although typically the core is thin enough to support only a single TE mode component perpendicular to the plane of the waveguide. In the ridge waveguide laser design of FIGS. 1 & 2, the width of the waveguide is defined primarily by the width of the bottom of the ridge 16 (e.g., approximately by the vertical, dashed lines 12.4 of FIG. 2). For Group III-V compound lasers operating at a center wavelength of about 1 $\mu$m, the width of the bottom of the ridge should be about 1.5 $\mu$m or greater. The calculations used to determine the appropriate width for a particular laser design are well known in the art.

Another aspect of the invention is the provision for transverse mode mixing; that is, a mechanism that couples transverse modes to one another in such a way that energy is transferred between modes without allowing one transverse mode to dominate to the exclusion of other transverse modes (as is the case in standard solid state lasers that do not have such a mode mixing mechanism). Thus, lasers in accordance with the invention operate simultaneously in multiple transverse modes. The mixed transverse modes then become the true eigen modes of the cavity resonator. Two techniques for mode mixing are illustrated: a scattering center technique depicted in FIG. 1, and a tandem waveguide technique depicted in FIG. 2.

In FIG. 1, a laser facet is provided with a coating 24, and an aperture, recess, protrusion or other structural feature 24.1 (hereinafter referred to simply as a feature) is formed in the coating illustratively by focused ion beam (FIB) etching as described in the Hopkins et al. patent, supra. The feature serves as a scattering center that provides the desired mode mixing, and as a side effect also lowers the Q of the resonator. Illustratively, the coating includes a multiplicity of dielectric layers (e.g., layers of $Al_2O_3$, $Zr_2O_3$ and/or $Si_3N_4$), or it may also include a multiplicity conductive layers (e.g. metal layers such as Ti, Al and/or Au) formed on the dielectric layers. The precise combination of materials and layer thicknesses is determined primarily by the desired reflectivity of the feature and the surrounding area of the facet, as is well known in the art. Illustratively, the feature is formed in one or more of the outermost layers of the coating. Depending on the application, the coating may be designed so that the feature has lower reflectivity than the surrounding areas of the coating, or conversely, the coating may be designed so that the feature has higher reflectivity than the surrounding areas. As pointed out in the next section, an optical filament tends to intersect the facet (i.e., the filament has its starting point) in a region of relatively higher reflectivity than the surrounding regions of relatively lower reflectivity.

Although the feature 24.1 is shown to be located essentially at the center of the x-y cross-section of the waveguide of the laser, there are reasons related to filament switching, discussed hereinafter, that indicate that positioning it off-center may be preferable.

In FIG. 3, on the other hand, the waveguide 32 (shown in top view) extends between the laser facets and is designed so as to include two sections 32.1 and 32.2 optically coupled and in tandem with one another. One section 32.1 is designed to support only a fundamental mode component 34 parallel to the plane of the waveguide, whereas the section 32.2 is designed to support the fundamental TE mode component 34 and a higher order TE mode component 36 parallel to the plane of the waveguide. Hence, as is well know in the art, section 32.1 is made to be narrower than the section 32.2. The single mode section 32.1 should be long enough to provide adequate gain for the laser to operate, whereas multimode section 32.2 should be made so that its length is essentially an integral number of beats of the filament formed therein by the mixing of the TE mode components therein, as discussed in the next section. A reflector 32.3 (shown schematically) is disposed on one facet of the laser, and the output 32.7 is taken from the opposite facet. Illustratively, as shown, the reflector 32.3 is formed on the facet of section 32.2, and the laser output is taken from the opposite facet of section 32.1 In addition, in order to achieve mode mixing in accordance with this embodiment of the invention, the longitudinal axes 32.4 and 32.5 of the two waveguide sections should be non-collinear in order to mix the fundamental TE mode component and an odd-ordered TE mode component, but should be collinear to mix the fundamental TE mode component and an even-ordered TE mode component.

As described in the next section, mixing of the transverse modes leads to formation of optical filaments that beat and, under appropriate phase conditions, mode-lock with one another. The dark, straight line extending longitudinally (z-axis) in waveguide section 32.1 and the dark, sinusoidal line in section 32.2 correspond to the peak intensity of the filaments. This embodiment of the invention has the advantage that it allows for higher output power (since it scatters less power out of the resonator) and provides for enhanced stability (in that filament switching, discussed below, is obviated).

Filament Formation and Beating

In accordance with this aspect of the invention, the mixing of transverse modes as described above leads to the formation of optical filaments (e.g., FIG. 5) that temporally beat with one another and modulate the laser output, illustratively at a frequency on the order of 1 THz. In summary, at least two different transverse modes at one frequency $\omega_1$ couple (i.e., spatially beat) to form a first filament, and at least two different transverse modes at another frequency $\omega_2$ also couple (i.e., spatially beat) to form a second filament. The two filaments temporally beat with one another so as to modulate the intensity of the laser output at frequency corresponding to the difference ($\omega_2 - \omega_1$). Illustratively, the $TE_{00}$ mode and the $TE_{01}$ mode are the two different transverse modes, and their components (e.g., 34 and 36, FIG. 2) parallel to the plane of the waveguide couple with one another. However, higher order TE mode components may also be involved in this process. Alternatively, if the waveguide is made thick enough to support higher order TE mode components perpendicular to the plane of the waveguide, yet narrow enough to support only the fundamental mode TE mode component parallel to the plane of the waveguide, then the TE mode components perpendicular to the plane of the waveguide may also couple to one another to form filaments that temporally beat with one another and modulate the laser output. In this case, the filament would exhibit an in-plane intensity distribution of nodes and peaks that would meander from the top to the bottom of the waveguide cross-section, rather than from side to side. Likewise, it may also be possible that transverse magnetic (TM) mode components (either parallel or perpendicular to the plane of the waveguide) may be made to couple with one another to form optical filaments.

Figure 4:
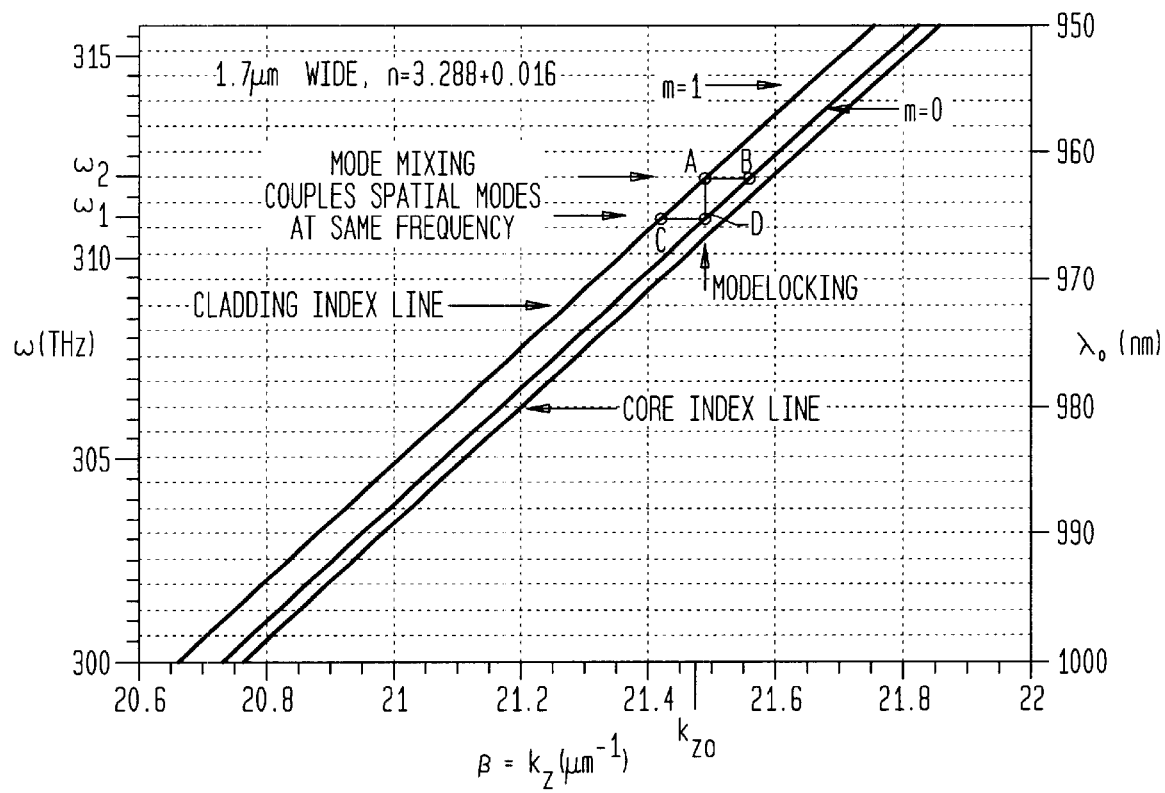
FIG. 4 a graph of waveguide dispersion useful in understanding how mode-locking of filaments occurs in the invention. $\lambda_o$ is the free-space wavelength, and $k_z$, is the propagation constant as measured in the waveguide.

To understand filament formation more fully, consider FIG. 4 which shows the dispersion of a waveguide which is 1.7 um wide (e.g., the dimension of the bottom of ridge 16) and has an effective refractive index 3.288+0.016 (typical of InGaP having a mole fraction of about 0.18–0.20 In) under the ridge 16. Outside the ridge 16 the effective refractive index is 3.288+0.016 (typical of a composite of InGaP and $SiO_2$). Also shown are the dispersion of the $TE_{00}$ mode (labeled m=0) and the $TE_{01}$ mode (labeled m=1). The principles discussed are applicable, however, to waveguides having other dimensions and refractive indices, and to higher order transverse modes, as long as the waveguide supports a multiplicity of transverse modes.

In FIG. 4 the four different waves (modes) that interact within the laser waveguide are labeled A, B, C and D. A & B are $TE_{01}$ and $TE_{00}$ modes, respectively, both having a frequency $\omega_2$, and C & D are likewise $TE_{01}$ and $TE_{00}$ modes, respectively, but both have a lower frequency $\omega_1 < \omega_2$. Because the two transverse modes at each frequency have different propagation velocities, a spatial beat pattern appears. In the case of the $TE_{01}$ and $TE_{00}$ modes, the beat pattern is a sinusoidal filament of the type shown in FIG. 5. One such filament is formed at each of the frequencies; i.e., A & B couple together (i.e., spatially beat) to form a filament at a frequency $\omega_2$, and C & D couple together (i.e., spatially beat) to form a separate filament at a frequency $\omega_1$. The two filaments at different frequencies temporally beat and produce a temporal modulation, illustratively at a THz frequency, of the intensity of the laser output.

In order to insure that two TE modes at the same frequency will spatially beat to form an optical filament, their relative electric field strengths should preferably be maintained within a suitable range. Take, for example, the coupling of $TE_{00}$ and $TE_{01}$ modes. Computer simulations, applicable to a variety of laser designs, indicate that the $TE_{01}$ field strength needed to form a filament should be about 1–200% of the $TE_{00}$ field strength. More specifically, computer simulations of the type depicted in FIGS. 5 & 6 indicate that filament formation is fairly well pronounced even when the $TE_{01}$ field strength is relatively low; e.g., 1% of the $TE_{00}$ field strength. As the relative field strength of the $TE_{01}$ mode increases above about 50%, the filament becomes more and more pronounced laterally (e.g., FIG. 5). Eventually (e.g., between about 100–200%) a loss of intensity in the filament as it crosses the longitudinal axis becomes increasingly apparent and causes the filament to look less sinusoidal and more cusp-like (i.e., cusp-shaped groups of optical fringes). In the prior art understanding of laser operation, it appears that researchers did not appreciate how such relatively large $TE_{01}$ field strengths arise given the reduced gain and increased losses of the higher order transverse modes and the modal gain competition with the fundamental transverse mode. In the present invention these requisite, relatively high $TE_{01}$ field strengths are realizable, as discussed below, and lead to the formation of useful filaments. In practice, however, during the operation of a particular laser, the balance between the filament fields may be considerably narrower that the full 1–200% simulation range considered herein to be a suitable operating range for a variety of possible laser designs.

In general, the intensities of the transverse modes are controlled by two principal effects: (1) the design of the waveguide, and (2) the diffraction of one mode into another (e.g., the $TE_{00}$ mode into the $TE_{01}$ mode). With respect to waveguide design, the width of the core (i.e., approximately the width of the ridge in the case of ridge waveguide lasers) should be large enough that the higher order transverse mode is not too close to cut off. For simplicity, let us assume in the remainder of this discussion that the higher order mode is a $TE_{01}$ mode. Said another way, there should be sufficient overlap between the $TE_{01}$ mode and the core that both the $TE_{00}$ mode and the $TE_{01}$ mode experience sufficient gain to support lasing of the coupled modes (even though the $TE_{01}$ mode will have less gain than the $TE_{00}$ mode). Even under such circumstances, however, the $TE_{01}$ mode is always more lossy than the $TE_{00}$ mode. Thus, conventional wisdom would predict that it is not possible to make the field strength of the $TE_{01}$ mode comparable to that of the $TE_{00}$ mode. The present invention demonstrates that the contrary is true. To understand how such field strength levels of the $TE_{01}$ mode are achieved, consider the diffraction (or refraction) of the $TE_{00}$ mode into the $TE_{01}$ mode. The following discussion, based upon a theoretical model believed to be reliable, is provided for pedagogical purpose only and is not intended to limit the scope of the invention as claimed.

As a filament begins to form, it causes the refractive index across the width of the waveguide to be non-uniform More specifically, the index is lower in the lasing filament regions than in the dark non-filament regions. Imagine now a $TE_{00}$ mode propagating along the waveguide and encountering such a non-uniform index profile. The side of the $TE_{00}$ mode that encounters the lower index region speeds up with respect to the opposite side that encounters the higher index region. Consequently, the phase front of the $TE_{00}$ mode is warped, and the direction of its propagation is altered from a path that is straight down the longitudinal axis to a path that bends across that axis. Further along the waveguide the opposite side of the $TE_{00}$ mode experiences a comparable effect but the bending is reversed. The result is that the propagating mode meanders back and forth across the waveguide. This side to side bending of the $TE_{00}$ mode represents a conversion of the radiation from the $TE_{00}$ mode into the $TE_{01}$ mode by the non-uniform refractive index profile across the waveguide. (Note, there is also a non-uniformity in the refractive index along the longitudinal axis that serves to mode-lock the longitudinal components of the filaments, as discussed in the next section.) This conversion from $TE_{00}$ mode to $TE_{01}$, mode increases the relative field strength of the $TE_{01}$ mode to much larger levels than would have been otherwise possible without the filament and its index gradient-inducing effect. However, the field can not build up in the $TE_{01}$, mode indefinitely. When too much energy is transferred from the $TE_{00}$ into the $TE_{01}$ mode, the filament becomes less and less sinusoidal (e.g., see the cusp-like intensity distribution shown in FIG. 6 for the case where the $TE_{01}$, mode field strength grows to about 150% of the $TE_{00}$ mode field strength), the diffraction efficiency for converting energy from the $TE_{00}$ mode into the $TE_{01}$, mode decreases, and the conversion process slows down to a point that the natural losses of the $TE_{01}$ mode balance the energy converted by diffraction (or refraction) from the $TE_{00}$ mode.

The length of the spatial beat is essentially the same for both filaments because this parameter is controlled by the difference in effective refractive indices between the $TE_{01}$, and $TE_{00}$ modes, and this difference changes negligibly over the range of frequencies of interest here. The essentially straight line relationships between frequency and propagation constant $k_z$, in FIG. 4 is evidence that this effect is negligible. The frequency range over which this effect is observed is approximately 300–315 THz for 0.98 μm lasers, and would be commensurately lower/higher for lasers operating at shorter/longer wavelengths.

In those embodiments where the mode mixing mechanism is a feature on the laser facet, it is understood, however, that a filament prefers to start in an area of the facet that has relatively higher reflectivity than surrounding areas of the facet. As noted earlier, when the facet has a coating in which a feature is formed, the feature itself may have either higher or lower reflectivity than the surrounding areas of the facet depending on the design and materials of the coating. Thus, a filament may start on a feature if it has higher reflectivity than surrounding facet areas, or it may start on the surrounding facet area if the converse is true. Therefore, the starting point of a filament may also be related to the location of the feature on the facet.

Figure 7:
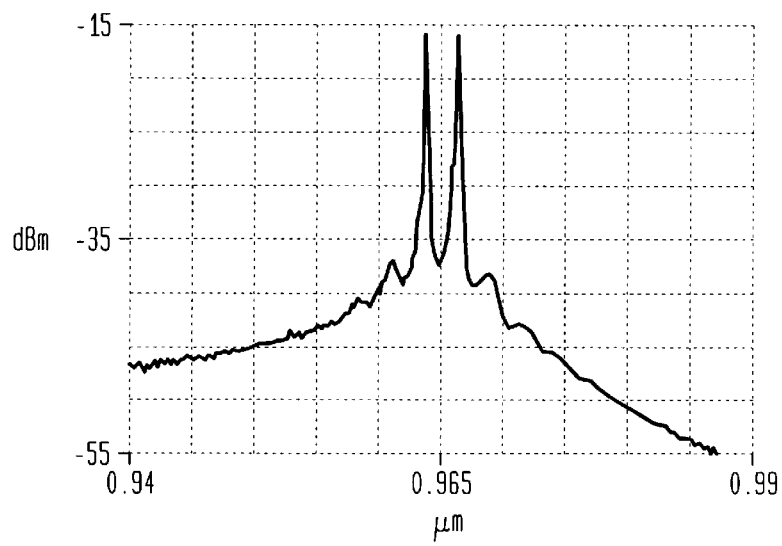
FIG. 7 shows the spectrum of a laser of the type depicted in FIG. 1. The laser operated simultaneously on two filaments separated by a frequency defined by a transverse mode filament grating. The ordinate is 5 dB/div, the abscissa is 5 nm/div and the resolution is 0.1 nm.

In the foregoing discussion it was assumed that the feature was positioned at the center of the waveguide. While this is indeed a viable location for some applications, there are advantages to locating the feature off-center. With the feature on-center the sinusoidal filament may take on one of two possible orientations represented by $+x_o\cos(k_z z)$ or $-x_o\cos(k_z z)$, where x is the position (parallel to the waveguide layers) of the peak intensity of the filament as a function of the z-position along the longitudinal axis of the waveguide. Since these orientations are nominally equivalent and equally likely (i.e., degenerate), the filament is free to switch back and forth between them depending on the conditions or perturbations favoring one or the other. For example, this switching may take place as the filament intensity builds up, thereby saturating the gain along the filament's path length. The gain along the alternate orientation then becomes larger, and the filament reforms in that orientation. The switching time corresponds to the linewidth of one of the frequency components (i.e., the longitudinal modes of FIG. 7). The switching of the filaments is exploited in a filament based detector as described in the concurrently-filed patent application, Peale 9, supra.

This switching can be inhibited, with a concomitant lengthening of the coherence time, by eliminating the degeneracy between the two filament orientations; e.g., by locating the feature off-center. In this embodiment of the invention, the filament takes on a cosine-like dependence originating from either the feature or the surrounding area of the facet (depending on which one is designed to have the higher reflectivity). Since one side of the facet has a larger modal reflectivity, the filament does not find it favorable to flip to the alternate cosine orientation even when the gain saturation sets in as the filament intensifies late in its buildup phase.

Mode-Locking

The presence of a filament within the waveguide creates, in effect, a periodic grating. Unlike conventional longitudinally periodic gratings used in DFB, DBR or fiber grating devices, the filament-induced grating creates spatial non-uniformities both longitudinally and laterally within the waveguide. While the theory of operation is not fully understood, it is believed that this longitudinal perturbation allows the two filaments to mode-lock to one another. Mode-locking has the advantage of narrowing the linewidth of the laser output.

The propagation velocity, or effective refractive index, of a wave is dependent both on its frequency and on the order (n, m) of its transverse mode. In principle, each of the four waves could have unique refractive indices. But, under mode-locked conditions one component of each coupled pair of waves (i.e., of each filament) has the same effective refractive index; i.e., in FIG. 4 this condition is represented by TE modes A & D having the same propagation constant $k_{zo}$. At each of the two frequencies, the $TE_{01}$ wave, which would not normally exist in the laser without a mode mixing mechanism, is extant because the mixing mechanism distributes radiation into both the $TE_{01}$ and $TE_{00}$ guided modes. In this way, energy at one frequency is forced into a shared distribution between two transverse modes. In a standard laser there is no intensity balance between two transverse modes because gain competition between two uncoupled, independent modes allows one mode (i.e., the $TE_{00}$ mode) to capture the majority of the pump energy. In contrast, the mode mixing mechanism in the present invention redistributes the modal energy between the two transverse modes on every round trip within the cavity resonator. One transverse mode does not gain intensity to the exclusion of the other.

Although $k_{zA}=k_{zD}=k_{zo}$ is the condition for strongest mode-locking, weaker mode-locking is also possible when $k_{zD}=(p/q)k_{zA}$, where p and q are positive integers and $p \leq q$. For example, when $p/q=\frac{1}{2}$, the THz pulses are twice as wide and twice as far apart as the case where $p/q=1$. To insure mode-locking several additional criteria should be satisfied: (1) the resonator should be long enough to contain a sufficient number of filament beats (i.e., grating periods, discussed hereinafter) to discriminate in favor of those frequencies corresponding to the period of the beat; and (2) the two filaments should have the same beat length; therefore, the resonator should be short enough that any slight difference in beat lengths does not cause the filaments to slip out of phase with one another along the longitudinal axis; this criterion is equivalent to requiring that the functional relationship between frequency and propagation constant can be represented by a pair of curves (e.g., the essentially straight lines, FIG. 4) such that the $\omega$-$k_z$ positions of the four modes A, B, C & D are located on the curves and form the vertices of a parallelogram.

EXAMPLE

This example describes a self-modulated semiconductor diode laser in accordance with one embodiment of the invention. Various materials, dimensions and operating conditions are provided by way of illustration only, and, unless otherwise expressly stated, are not intended to limit the scope of the invention.

The laser comprised a Group III-V compound ridge waveguide device of the type shown in FIG. 1 and designed to operate at a center wavelength of about 0.98 μm. More specifically, the laser was designed to have a DH optical waveguide that included a core that was about 59 nm thick sandwiched between opposite-conductivity-type, cladding layers that were each about 200 nm thick. The cladding layers comprised InGaP with about 18–20% In by mole fraction, and the core comprised a MQW active region. The MQW region included three GaAs barrier layers interleaved with two InGaAs quantum well layers that emitted radiation at the desired center wavelength of 0.98 μm. The ridge was about 3 μm wide at its top and about 1.7 μm wide at its bottom. The laser had a pair of parallel facets (one cleaved and the other FIB etched) that formed a resonator about 750 μm long; one facet was coated with multiple layers of dielectric followed by multiple layers of metal; the other facet was left uncoated. Using FIB techniques, an essentially rectangular recess measuring about 0.5 µm high by 1.0 µm wide was etched in the outermost metal layer of the coating. The recess was located entirely on one side of the center of the waveguide cross-section in order to suppress filament switching.

Figure 5:
FIG. 5 is a computer simulation of an optical filament formed by the coupling of different transverse modes having the same frequency in a planar waveguide; i.e., this figure is a top view showing the intracavity, in-plane intensity distribution of the coherent superposition of coupled $TE_{00}$ and $TE_{01}$, modes within the waveguide core. When the laser includes an appropriate mode-mixing mechanism of the type discussed hereinafter, this pattern is stationary with respect to the waveguide's longitudinal boundaries. In this figure, and for purposes of illustration only, the electric field strength of the $TE_{01}$ mode is 75% that of the $TE_{00}$ mode. Other percentage relationships are feasible in which cases the filament will still have a meandering shape but it will differ in detail from that shown in this figure. (See, for example, FIG. 6.) The dimensions of the figure are not to scale. In particular, the effective refractive index difference between the $TE_{00}$ and $TE_{01}$ modes has been exaggerated so that they differ by 5%, thereby allowing the optical fringes and the beat period of the filament to be captured in a single photo image. For this laser design the transverse dimension, which corresponds to the waveguide width, is typically about 1.5 $\mu$m, and the longitudinal period of the filament beat is approximately 70 $\mu$m.
Figure 6:
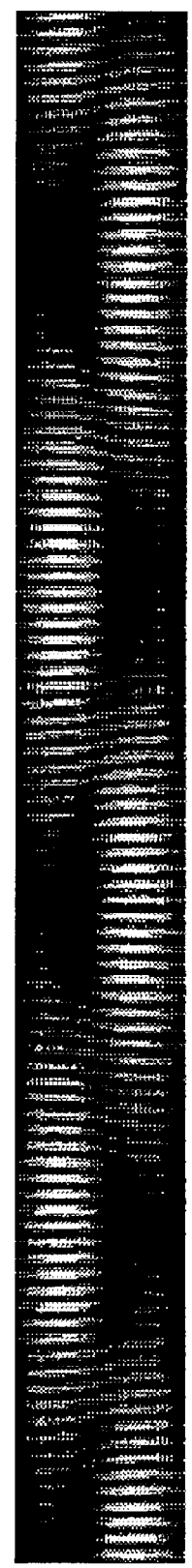
FIG. 6 is a computer simulation similar to that of FIG. 5 but for the case where the electric field strength of the $TE_{01}$, mode is 150% of the electric field strength of the $TE_{00}$ mode.

The waveguide supported both $TE_{00}$ and $TE_{01}$ modes, and the recess acted as a scattering center that coupled these transverse modes and formed two separate filaments at two different frequencies. A simulation of a filament is shown in FIG. 5. The two filaments mode-locked and nearly 100% modulated the laser output at a frequency of 0.84 THz. The total power measured by a broad area photodetector directly in front of the output facet was about 1.9 mW. On the other hand, an output power of about 25 µW, as measured by a spectrometer used in the experiments (e.g., to generate the spectrum of FIG. 7), was relatively low because of the small collection efficiency of the lens used to couple the laser output to the fiber input of the spectrometer.

Figure 8:
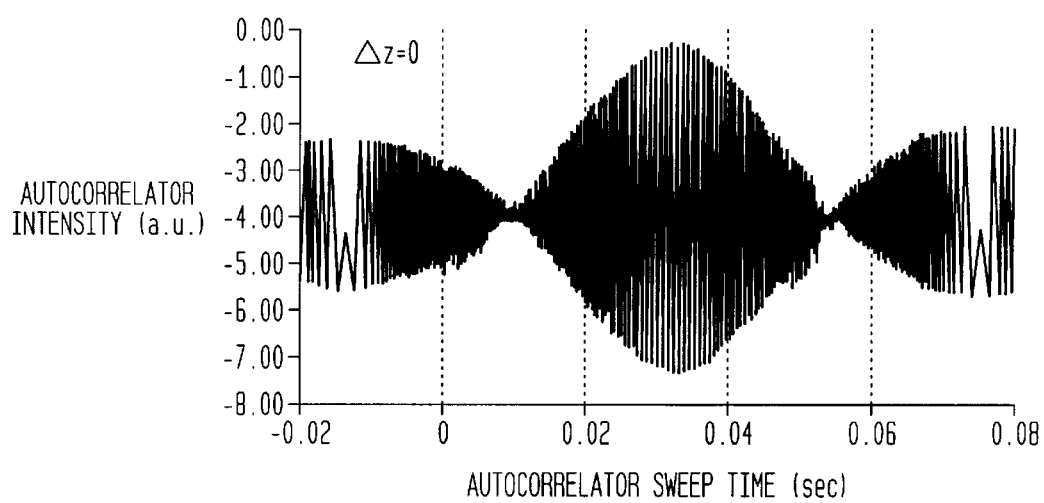
FIG. 8 is an interferometric autocorrelator trace of 980 nm radiation from a dual spatial mode, self-modulated laser of the type shown in FIG. 1. The spectrum of the laser output is shown in FIG. 7. The nominal lengths of the interferometer arms were equal to one another, hence the indication that $\Delta z=0$. The displacement of the interferometer arm lengths that produced the major nodes in the interferogram corresponds to a frequency difference of 0.84 THz (the modulation frequency) in agreement with the 3.5 nm spacing of the spectra peaks in FIG. 7.

The periodic nature of each filament served as a weak refractive index grating which subsequently favored particular longitudinal mode wavevectors. Two transverse modes (e.g., modes A & D of FIG. 4) sharing one such common longitudinal wavevector ($k_{zo}$) were separated by a frequency of 0.84 THz. This simultaneous operation of two coupled modes does not upset the structure of the corresponding filament since all pairs of transverse modes operating at any particular frequency produce filaments with the same period length. The temporal beating between filaments of different frequencies produced modulation of the laser output. The coherence of the beating was demonstrated by interferometric autocorrelation as shown in FIG. 8. The correlation length of the beats was approximately 228 nm which corresponds to a linewidth of 1.3 GHz.

Comparable results were obtained with other versions of this 0.98 µm laser design; e.g., lasers in which the MQW core was 114 nm thick, lasers in which the recess was 100–300 nm square; and lasers in which the recess was centered on the waveguide cross-section.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A self-modulated solid state laser comprising
   an intracavity optical waveguide in which laser radiation propagates, a portion of said radiation emerging from said waveguide to form a laser output, characterized in that
   said waveguide supports a multiplicity of lasing filaments each at a different optical frequency, at least two of said filaments temporally beating with one another so as to modulate the intensity of the said laser output at a frequency corresponding to the difference of said filament frequencies.

2. The invention of claim 1 wherein said waveguide is planar and supports a multiplicity of transverse modes and said laser includes a mode mixing mechanism that mixes the energy of at least two pairs of said modes, each coupled pair generating a separate one of said filaments.

3. The invention of claim 2 wherein said waveguide supports a multiplicity of TE modes.

4. The invention of claim 3 wherein said transverse modes include a first fundamental mode component and a first higher order mode component that oscillate at a first frequency and are coupled to form a first filament and further include a second fundamental mode component and a second higher order mode component that oscillate at a second frequency and are coupled to form a second filament, said filaments temporally beating with one another so as to modulate said laser output a frequency corresponding to the difference between said first and second frequencies.

5. The invention of claim 4 wherein said mode components are TE mode components parallel to the plane of said waveguide.

6. The invention of claim 4 wherein said filaments are mode-locked with one another.

7. The invention of claim 6 wherein said first fundamental mode component and said first higher order mode component have wavevectors $k_{zA}$ and $k_{zB}$, respectively, and said second fundamental mode component and said second higher order mode component have wavevectors $k_{zC}$ and $k_{zD}$, respectively, and wherein $k_{zD}=(p/q)k_{zA}$ and p and q are positive integers and $p \leq q$.

8. The invention of claim 2 wherein said mode mixing mechanism includes means for scattering energy from one parallel transverse mode to another.

9. The invention of claim 8 wherein said laser includes a resonator formed by a pair of essentially parallel surfaces, said scattering means includes a coating on at least one of said surfaces, said coating having at least one feature therein for scattering radiation.

10. The invention of claim 9 wherein said feature has higher reflectivity than the surrounding areas of said one surface.

11. The invention of claim 9 wherein said feature has lower reflectivity than the surrounding areas of said one surface.

12. The invention of claim 9 wherein said feature is located at essentially the center of the cross-section of said waveguide taken perpendicular to the longitudinal axis of said laser.

13. The invention of claim 9 wherein said feature is displaced from the center of the cross-section of said waveguide taken perpendicular to the longitudinal axis of said laser.

14. The invention of claim 2 wherein said mode mixing mechanism includes, within said waveguide, a first waveguide portion that supports only a single transverse mode and a second waveguide portion that supports said single transverse mode and at least one other transverse mode, said portions being optically coupled to one another.

15. The invention of claim 14 wherein the longitudinal axes of said waveguide portions are collinear.

16. The invention of claim 14 wherein the longitudinal axes of said waveguide portions are not collinear.

17. The invention of claim 6 wherein said laser output is modulated at a frequency on the order of 1 THz.

18. A self-modulated solid state laser comprising
   an optical cavity resonator,
   an active medium disposed within said resonator,
   means for applying pumping energy to said active medium so as to generate lasing radiation with said resonator, a portion of said radiation emerging from said resonator to form a laser output, and
   an intracavity planar waveguide for guiding said radiation, characterized in that said waveguide supports a multiplicity of transverse electric modes and includes means for mixing the energy between at least two pairs of said transverse modes, thereby to couple a first pair of transverse modes having a first optical frequency with one another and to couple a second pair of transverse modes having a second optical frequency with one another, thereby to form at least two optical filaments that temporally beat with one another and mode lock so as to modulate said laser output at a frequency of the order of 1 THz corresponding to the difference between said first and second frequencies.

* * * * *